(12) United States Patent
Cozzolino

(10) Patent No.: US 7,944,303 B2
(45) Date of Patent: May 17, 2011

(54) SUPER SOURCE FOLLOWER OUTPUT IMPEDANCE ENHANCEMENT

(75) Inventor: Carmine Cozzolino, Encinitas, CA (US)

(73) Assignee: Fairchild Semiconductor Corporation, Portland, ME (US)

( * ) Notice: Subject to any disclaimer, the term of this patent is extended or adjusted under 35 U.S.C. 154(b) by 44 days.

(21) Appl. No.: 12/356,566

(22) Filed: Jan. 21, 2009

(65) Prior Publication Data
US 2010/0182086 A1   Jul. 22, 2010

(51) Int. Cl.
*H03F 3/16*   (2006.01)
(52) U.S. Cl. ......................................... 330/277; 330/311
(58) Field of Classification Search .................. 330/253, 330/311, 290, 296, 277
See application file for complete search history.

(56) References Cited

U.S. PATENT DOCUMENTS
7,304,540 B2 * 12/2007 Tu .................................. 330/290

OTHER PUBLICATIONS

Kong et al., "An Ultra Low Output Resistance and Wide Swing Voltage Follower", Communications, International Conference on Circuits and System, 2007. ICCCAS 2007. Jul. 11-13, 2007, pp. 1007-1010.

* cited by examiner

*Primary Examiner* — Hieu P Nguyen
(74) *Attorney, Agent, or Firm* — Cesari and McKenna, LLP

(57) ABSTRACT

A source follower circuit is disclosed with an added amplifier that extends the low input voltage linear range while providing a lower output impedance. The drain of the source follower MOSFET is coupled to a gain stage that drives a second MOSFET (or other type transistor) with its drain coupled to the follower output. High impedance current sources bias the circuitry, and the difference amplifier has a reference voltage at one input. The difference amplifier with the reference voltage provides a feedback mechanism that maintain adequate drain to source voltage across the follower MOSFET to enhance the low input voltage linearity along with reducing the follower output resistance.

4 Claims, 5 Drawing Sheets

Rout = 1/(gm1*gm2*ro1*Av)

Rout = 1/(gm1*gm2*ro1)

Rout = 1/(gm1*gm2*ro1*Av)

Rout = 1/(gm1*gm2*ro1*Av)
Av = gm3*(rds4//rds5)

SUPER SOURCE FOLLOWER OUTPUT IMPEDANCE ENHANCEMENT

BACKGROUND OF THE INVENTION

1. Field of the Invention

The present invention relates to source follower circuits and more particularly to source follower circuits with lower output impedances.

2. Background Information

Source follower circuits are ubiquitous in circuitry especially analog circuitry. They are often found as interface circuits where the source follower: presents a high impedance (to not load down) to a sending circuit; presents a low impedance (to not diminish the signal) to a receiving circuit; and demonstrates a gain of one.

Source followers extends a line of follower circuits from cathode followers (tubes) to emitter followers (bipolar transistors). Basically all follower circuits present a gain of one, a high impedance to the sending circuit and a low impedance to a receiving circuit.

FIG. 1 illustrates a known source follower circuit with an added MOSFET M2.

The source of M1 is driven by a current source I1, and the drain of M1 and the gate of M2 are driven from a current sink I2. The drain current of M2 will be I1 minus I2, and I1 is set higher than I2.

Assuming the current sources have very high output impedances the equation for the output impedance for FIG. 1 is:

$$Rout = 1/(gm1)(gm2)(ro1).\qquad\text{Eq. 1}$$

Here gm1 is the transconductance of M1, gm2 is the transconductance of M2 and ro1 is the output impedance of M1.

The drain voltage of M1 is set by the gate-source voltage of M2. When the IN signal in FIG. 1 approaches ground or below ground, the drain-source voltage of M1 may approach the saturation voltage of M1 driving M1 out of its saturation region and causing non-linearities in the OUT signal.

SUMMARY OF THE INVENTION

The present invention includes a first MOSFET source follower circuit, with an additional gain stage that enhances the source follower output impedance and low input voltage level linearity. The drain of the first MOSFET is coupled to one input of a difference amplifier with its output coupled to the gate of a second MOSFET. The drain of the second MOSFET is coupled to the follower output—the source of the first MOSFET.

The other input to the difference amplifier is coupled to a reference voltage. The combination of the amplifier and second MOSFET provide a feedback via the follower output where current is diverted from the first MOSFET causing the voltage at the drain of the first MOSFET to be equal to the reference voltage. The net effect is to maintain a drain to source voltage across the first MOSFET when the input signal voltage is low, thus keeping the first MOSFET in its active linear range.

In another embodiment the MOSFET M2 may be replaced by a bipolar or hybrid transistor.

Illustratively, the amplifier may include MOSFETs, bipolar, hybrids and other such components in combination.

It will be appreciated by those skilled in the art that although the following Detailed Description will proceed with reference being made to illustrative embodiments, the drawings, and methods of use, the present invention is not intended to be limited to these embodiments and methods of use. Rather, the present invention is of broad scope and is intended to be defined only as set forth in the accompanying claims.

BRIEF DESCRIPTION OF THE DRAWINGS

The invention description below refers to the accompanying drawings, of which.

DETAILED DESCRIPTION OF AN ILLUSTRATIVE EMBODIMENT

Figure 2:
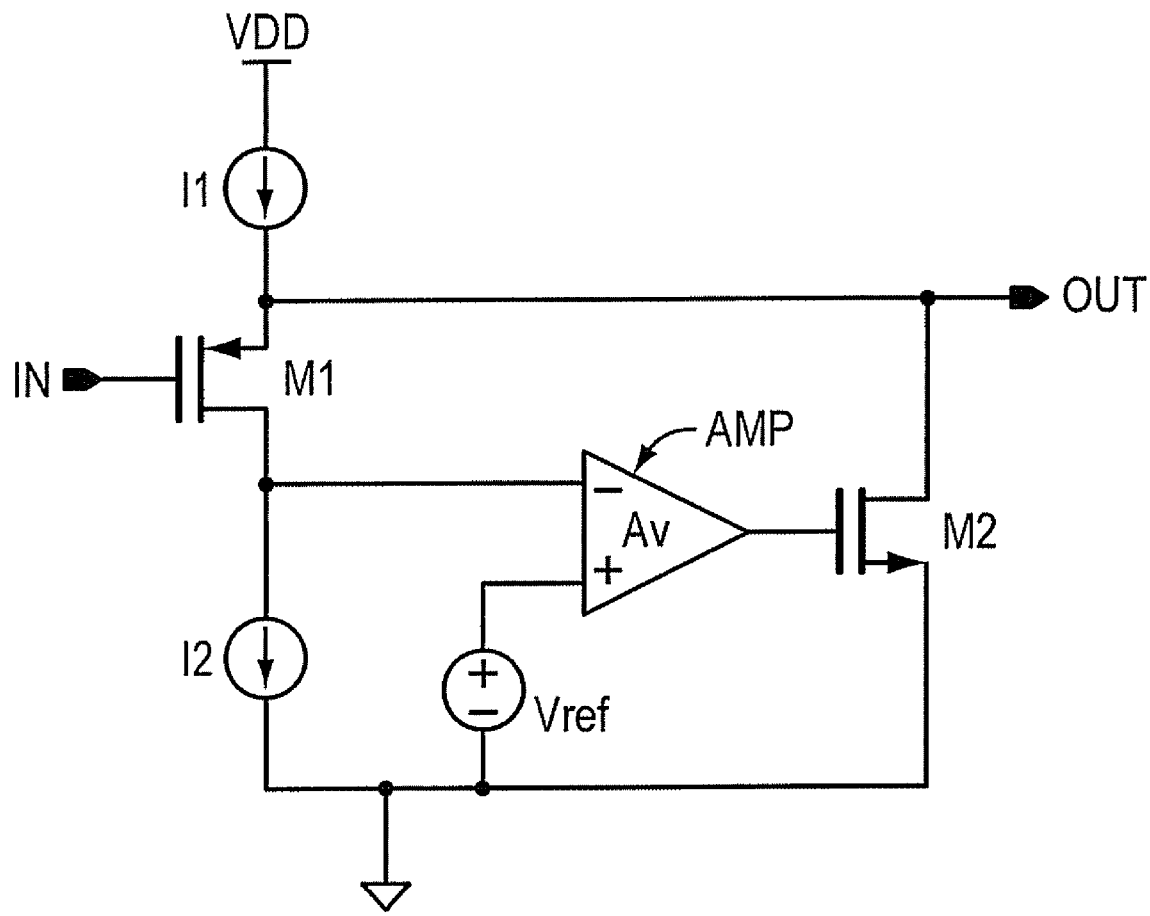
FIG. 2 is a circuit diagram of one embodiment of the present invention.

FIG. 2 includes an amplifier AMP with its inverting input coupled to the drain of M1, its non-inverting input coupled to Vref, a reference voltage, and its output driving the gate of M2. "Coupled" as used herein includes connection through active or passive components.

The AMP gain is $A_v$, and assuming the current sources have very high impedances, the output impedance of the circuit in FIG. 2 is:

$$Rout = 1/(gm1)(gm2)(ro1)(Av).\qquad\text{Eq. 2}$$

By inspection Eq. 2 adds the gain function Av to Eq. 1 that reduces the value of Rout, but includes the added benefit of restricting the drain voltage of M1 to Vref via the feedback of M2. The drain current of M2 will be I1 minus I2, and I1 is set higher than I2. In this circuit when IN goes low to or even below ground, M1's drain voltage will be controlled at Vref. This will maintain a drain to source voltage across M1 keeping it in its saturation region. This improves linearity and reduces distortion with low or negative input voltage signals. Vref is set between the saturation voltage of the current source I2 (thus maintaining it as a current source) and the threshold of M2. In one application Vref is 500 mV which is about midway between the saturation voltage of I2 and the threshold of M2. This setting maintains a low output impedance at the drain of M2 while retaining an optimum voltage dynamic range at the OUT node.

Figure 3:
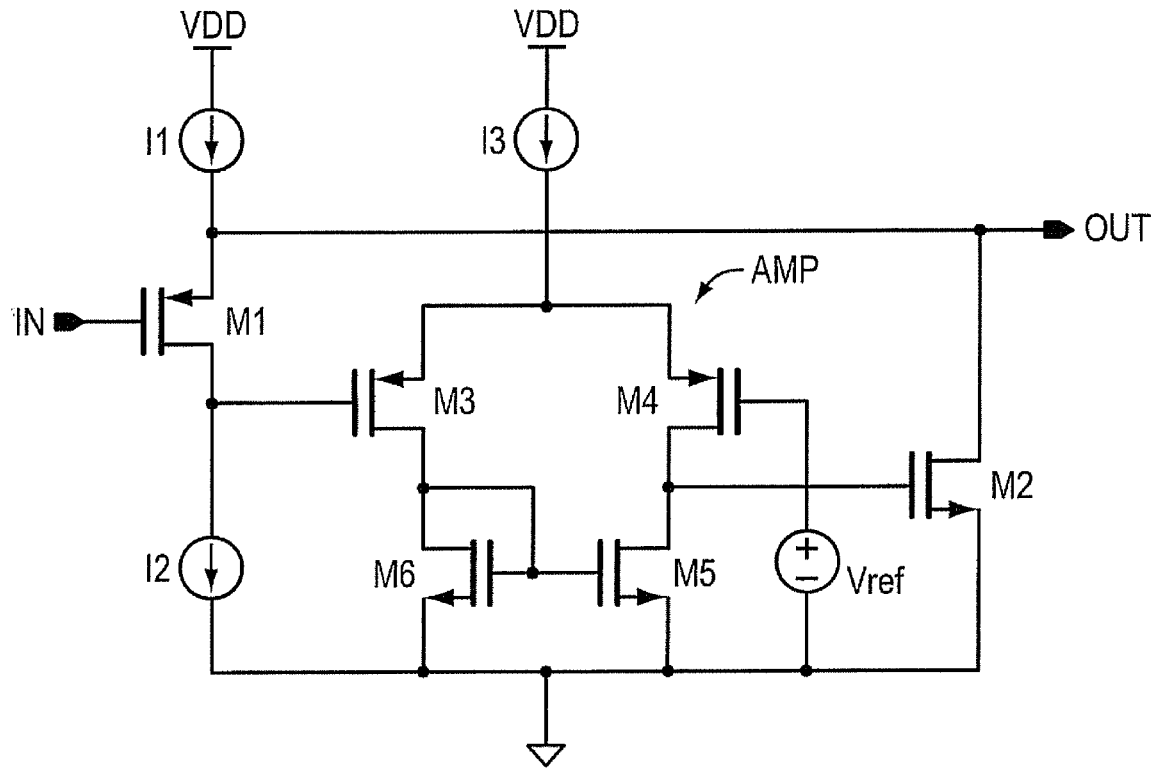
FIG. 3 is a more detailed circuit diagram of the circuit of FIG. 2.

FIG. 3 illustrates more detail of a circuit implementation of the AMP of FIG. 2. In FIG. 3 the output of the differential AMP is the connected drains of M4 and M5 that are coupled to the gate of M2. Again assuming current source of very high impedances and the Vref of very low impedance, the low frequency AC gain of the AMP is:

$$Av = gm3(rds4*rds5)/(rds4+rds5).$$

rds4 and rds5 are the effective drain to source resistances of M4 and M5, respectively, and * indicates multiplication.

Figure 1:
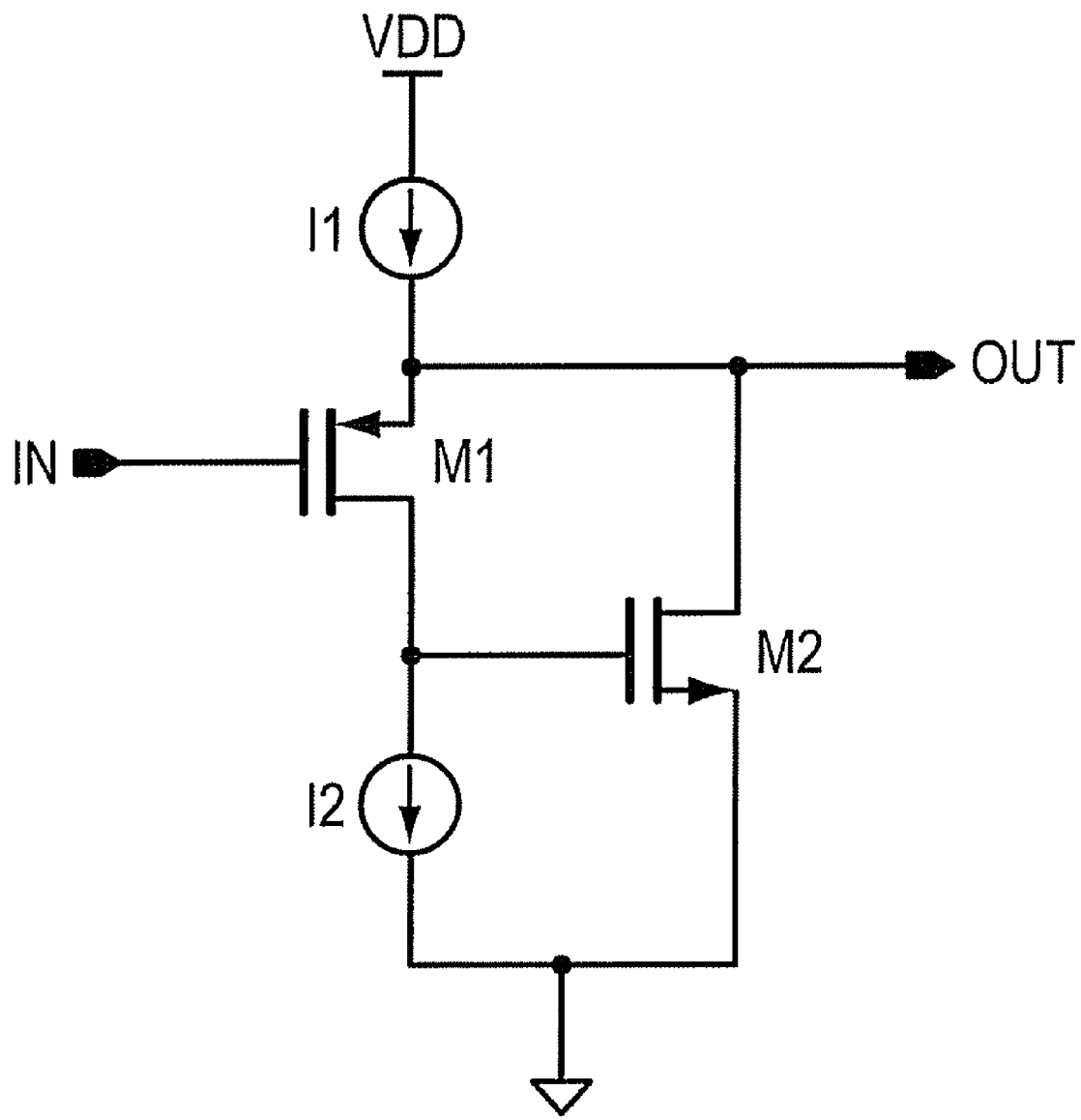
FIG. 1 is a circuit diagram of a prior art follower circuit.
Figure 4:
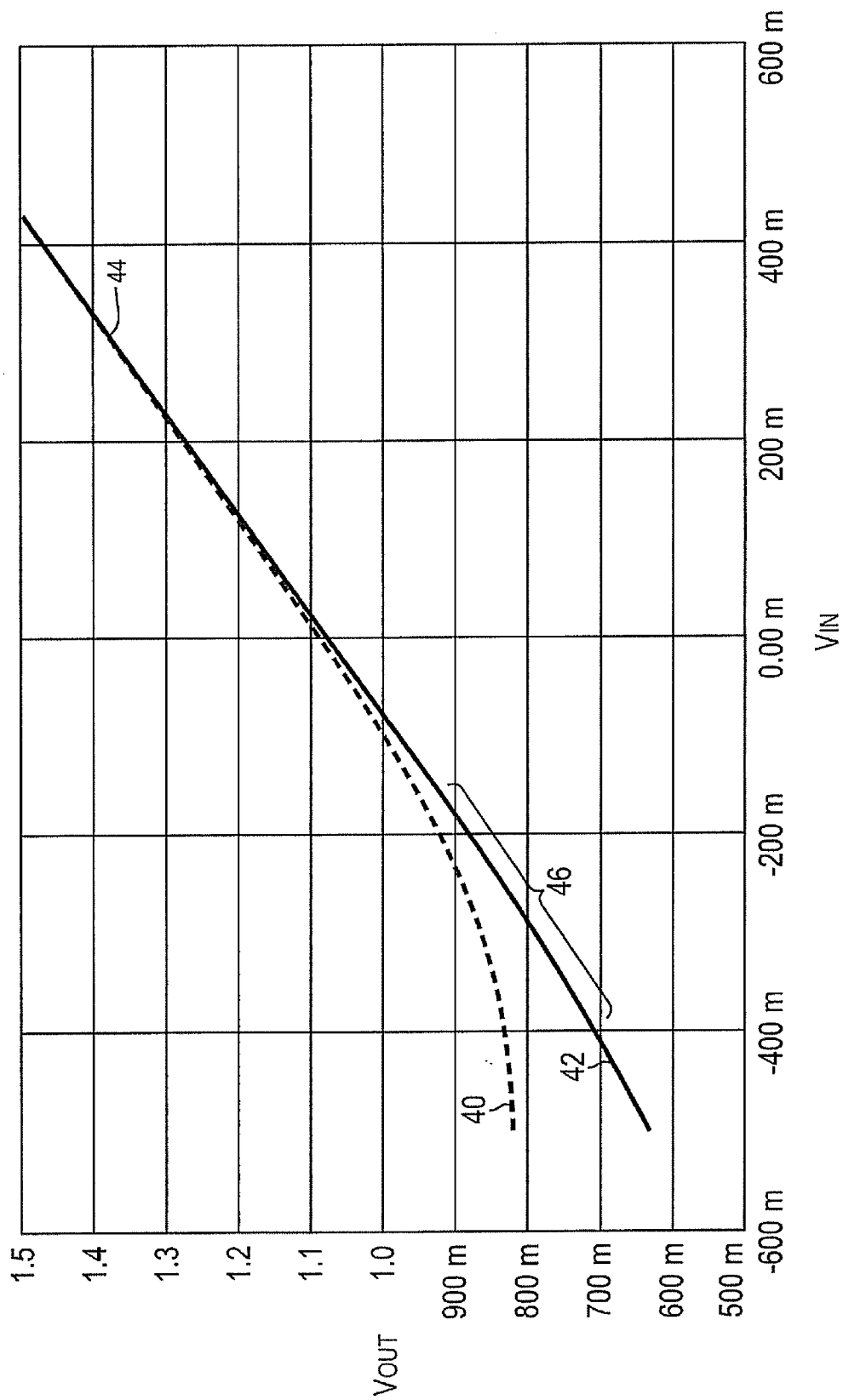
FIG. 4 is a graph of small signal gain of the circuit of FIG. 3.

FIG. 4 illustrates the low voltage input signal linearity improvement of the circuit of FIGS. 2 and 3 compared to the prior art circuit of FIG. 1. The vertical scale is Vout and the horizontal scale is Vin. When Vin is in the + voltage range at, say, +400 mV, Vout is at about +1.47V. The offset between these values represents the threshold of the MOSFET M1. At these positive voltage levels, the small signal AC gain for both the prior art circuit and the inventive circuit is near one and can be read directly from the traces near the curves at 44.

But where Vin goes below zero 46, where the trace 42 for the inventive circuit embodiments remains linear at Vin voltages levels down to −400 mV. The trace 40 for the prior art circuit loses linearity when Vin nears −100 mV.

Figure 5:
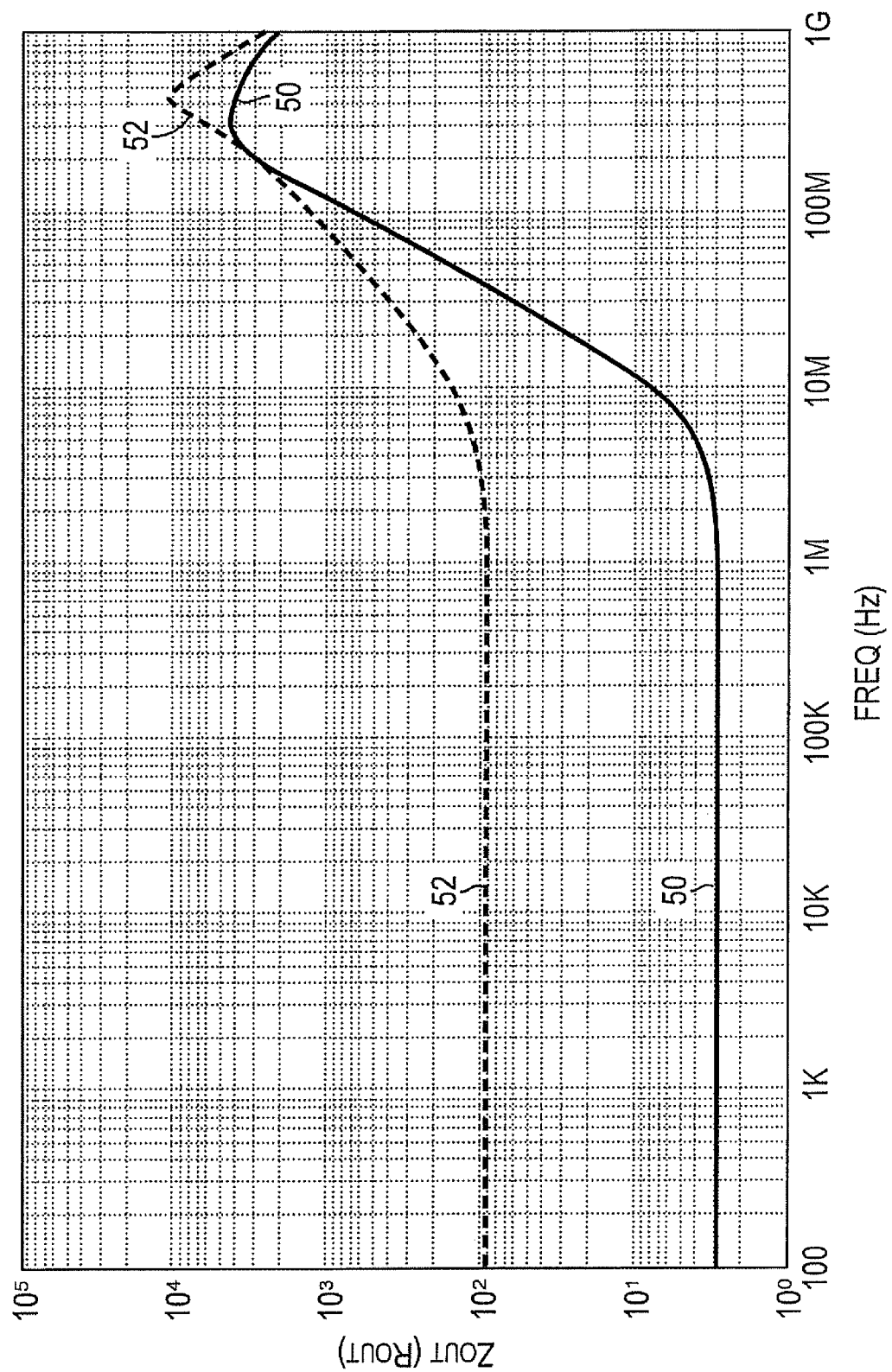
FIG. 5 is a graph of the frequency responses of Zout (Rout) of the prior art circuit in FIG. 1 and the circuit in FIG. 3.

FIG. 5 illustrates Zout (that is output impedance) 50 for the circuits of FIGS. and 3 and Zout 52 for a prior art circuit of FIG. 1. Zout 50 at the lower frequencies is about +2.8 ohms while Zout 52 is about 93.5 ohms. Both Zout's rise at frequencies of about 3 MHz. Zout is used for FIG. 5 since the output impedance is plotted over frequency. Rout used above refers to the same Zout but at the lower frequencies.

Referring back to FIG. 3, and as mentioned above, the MOSFETs M2 to M6 could be bipolar, hybrid or combinations thereof.

It should be understood that above-described embodiments are being presented herein as examples and that many variations and alternatives thereof are possible. Accordingly, the present invention should be viewed broadly as being defined only as set forth in the hereinafter appended claims. As used in the claims, the term "current source" is intended to be generic to either sources or sinks.

What is claimed is:

1. A source follower circuit comprising:
    a first MOSFET having a gate coupled to an input signal, a source coupled to a first output, and a drain;
    a high impedance circuit providing current coupled to the first MOSFET drain;
    a difference amplifier having two inputs, one input coupled to the first MOSFET drain, and the other input, coupled to a reference voltage, said amplifier having an output connected to the gate of a second MOSFET that has a drain coupled to the said first output, wherein gm1 is the transconductance of the first MOSFET, gm2 is the transconductance of the second MOSFET, Av is the gain of the difference amplifier, and wherein the source follower circuit output impedance is Rout=1/(gm1*gm2*ro1*Av), where ro1 is the output impedance of the first MOSFET,
    wherein the source follower circuit maintains the drain of the first MOSFET equal to the reference voltage.

2. The source follower of claim 1 further comprising a current source coupled to the source of the first MOSFET.

3. A source follower circuit having an input terminal and an output terminal, comprising:
    a first MOSFET having a gate coupled to said input terminal, having a source coupled to a first output terminal, and having a drain;
    a high impedance circuit coupled to said drain for providing current thereto;
    a difference amplifier having a first input coupled to the drain of said MOSFET, having a second input for coupling to a reference voltage, and having an output connected to the output terminal of the source follower circuit through a second MOSFET having a gate connected to receive the output of said difference amplifier, and having a drain connected to the source follower circuit output terminal, and
    whereby the source follower circuit maintains the drain of said first MOSFET equal to the reference voltage.

4. A source follower circuit according to claim 3 which includes a current source connected to the source of said first MOSFET.

* * * * *